US 6,686,825 B2

(12) United States Patent
Tamezawa et al.

(10) Patent No.: US 6,686,825 B2
(45) Date of Patent: Feb. 3, 2004

(54) CHIP INDUCTOR AND MANUFACTURING METHOD THEREFOR

(75) Inventors: Eita Tamezawa, Fukui-ken (JP); Keishiro Amaya, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/290,377

(22) Filed: Nov. 8, 2002

(65) Prior Publication Data
US 2003/0095028 A1 May 22, 2003

Related U.S. Application Data

(62) Division of application No. 09/850,952, filed on May 9, 2001.

(30) Foreign Application Priority Data
May 9, 2000 (JP) .......................... 2000-135562

(51) Int. Cl.$^7$ ................................ H01H 5/00
(52) U.S. Cl. .................. 336/200; 336/232; 336/223
(58) Field of Search ................ 336/200, 223, 336/232; 29/602.1

(56) References Cited

U.S. PATENT DOCUMENTS 5,729,887 A * 3/1998 Irie ..................... 29/602.1
6,124,779 A * 9/2000 Yamamoto ............. 336/200

FOREIGN PATENT DOCUMENTS

| JP | 7-050488 A | 2/1995 |
| JP | 7-106192 A | 4/1995 |
| JP | 9-092540 A | 4/1997 |
| JP | 9-270326 | 10/1997 |
| JP | 2000-036413 A | 2/2000 |

* cited by examiner

Primary Examiner—Karl D. Easthom
Assistant Examiner—Jennifer A. Poker
(74) Attorney, Agent, or Firm—Keating & Bennett, LLP

(57) ABSTRACT

A chip inductor has electrode layers, insulating layers disposed on the electrode layers, and an uppermost insulating layer all disposed on a ceramic board. An inorganic pigment such as a Co oxide or an Al oxide is added to the insulating layer at a concentration of from about 2% to about 20% by weight. Break grooves are formed in the form of a lattice on the insulating layer by a laser beam irradiation, and the board is divided along the grooves. By adding the inorganic pigment, the break grooves are effectively formed, and the mother board is divided accurately along the break grooves, such that a chip inductor having an increased L value and an increased Q value is produced.

8 Claims, 2 Drawing Sheets

CHIP INDUCTOR AND MANUFACTURING METHOD THEREFOR

This application is a Divisional of U.S. patent application Ser. No. 09/850,952 filed May 9, 2001, currently pending.

BACKGROUND OF THE INVENTION

1. Field of the Invention

The present invention relates to a chip inductor and a manufacturing method therefor. More particularly, the present invention relates to a chip inductor manufactured by providing electrode layers having specific patterns and insulating layers on a ceramic mother board, followed by dividing the mother board, and to a method for manufacturing the chip inductor.

2. Description of the Related Art

Conventionally, multilayer chip inductors are manufactured by providing electrode layers having specific patterns and insulating layers on a ceramic (mainly alumina) mother board, and then by dividing the mother board along the break grooves formed thereon. However, when the division is performed along the break grooves formed on the mother board, the division surface often deviates from the grooves. This results in reduced dimensional precision, which is accentuated as the chip inductors are miniaturized. In the worst case, some of the electrode layers are exposed to the outside. Furthermore, since a wider margin must be provided for the division, the space for forming the internal electrode layers is substantially decreased, which causes the L value to be substantially decreased.

On the other hand, another conventional method for manufacturing an inductor is described in Japanese Unexamined Patent Application Publication No. 11-176685, in which a conductive film is formed on the side surfaces of a ferrite core, and the conductive film is subjected to laser machining to form a spiral conductive pattern.

In the course of developing the present invention, various attempts were made to use the method disclosed in the above-described Publication for manufacturing the conventional chip inductor. In that method, glass was used to define the uppermost insulating layer, and the insulating layer was irradiated with a laser beam to form break grooves. However, glass was difficult to cut with the laser beam, and therefore, it was not possible to divide the board.

SUMMARY OF THE INVENTION

To overcome the above-described problems with the prior art, preferred embodiments of the present invention provide a chip inductor manufactured from a mother board which is accurately divided along break grooves, and requires only a narrow margin for the division, such that a large L value is achieved, as well as to provide a method for manufacturing the chip inductor.

Furthermore, preferred embodiments of the present invention provide a chip inductor that eliminates and prevents degradation of the Q value at a high frequency.

A chip inductor according to a preferred embodiment of the present invention includes electrode layers with specific patterns and insulating layers on a ceramic board, wherein a pigment including an inorganic oxide is added to an uppermost insulating layer within the range of about 2% to about 20% by weight.

The chip inductor having the unique configuration described above is manufactured preferably by providing electrode layers having specific patterns and insulating layers on a ceramic mother board, adding a pigment including an inorganic oxide to an uppermost insulating layer within the range of about 2% to about 20% by weight, irradiating the uppermost insulating layer with a laser beam to form lattice-shape grooves, and then dividing the mother board along the grooves.

When a pigment including an inorganic oxide is added to an insulating layer (made of glass, a polyimide, or other suitable material), the pigment absorbs the energy of a laser beam such that break grooves are effectively formed. Grooves having a width as narrow as about 30 µm are formed by the laser beam irradiation. When a mother board is divided along these grooves, deviation of the division surface from the grooves is avoided. Furthermore, the margin for the division is substantially narrower, and therefore, the area for providing the electrode layers is greatly increased, with the result that a larger L (inductance) value is achieved at a high frequency.

As the inorganic oxide to be added to the insulating layer, oxides of Co, Al, Fe, Mn, or other suitable materials are used. More particularly, when a Co oxide and/or an Al oxide is used, deterioration of the Q value at a high frequency is prevented.

Furthermore, according to a preferred embodiment of a manufacturing method of the present invention, in addition to the formation of grooves for breaking on the above-described uppermost insulating layer, grooves may be formed on the bottom surface of the mother board which correspond to the grooves formed on the above-described uppermost insulating layer. The generation of burrs is prevented at the time of dividing the mother board, and the outer dimensional precision of the chips is further improved.

It is noted that the laser ray absorption effect does not occur when the amount of the inorganic oxide added to the insulating layer is less than about 2% by weight, and that the Q value and the strength of the insulating layer (deterioration of sintering characteristics) substantially deteriorates if the amount of inorganic oxide exceeds about 20% by weight.

Other features, elements, characteristics and advantages of the present invention will become more apparent from the following detailed description of preferred embodiments of the present invention with reference to the attached figures.

DETAILED DESCRIPTION OF PREFERRED EMBODIMENTS

Preferred embodiments of a chip inductor and a manufacturing method therefor according to the present invention will be explained below, referring to the attached drawings.

Figure 1A:
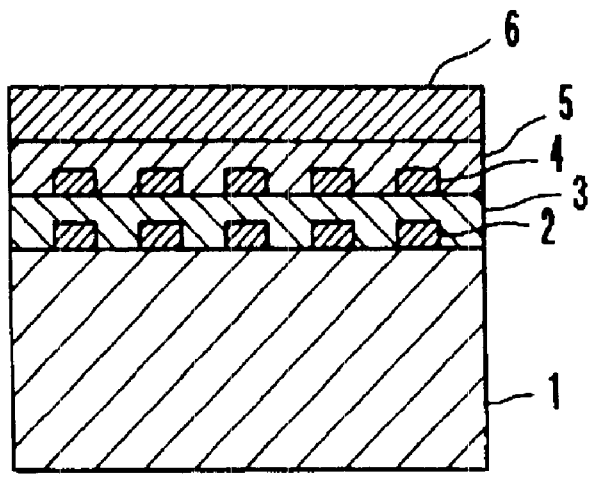
FIGS. 1A to 1C are cross-sectional views illustrating the manufacturing steps for a chip inductor according to the first preferred embodiment of the present invention.
Figure 1B:
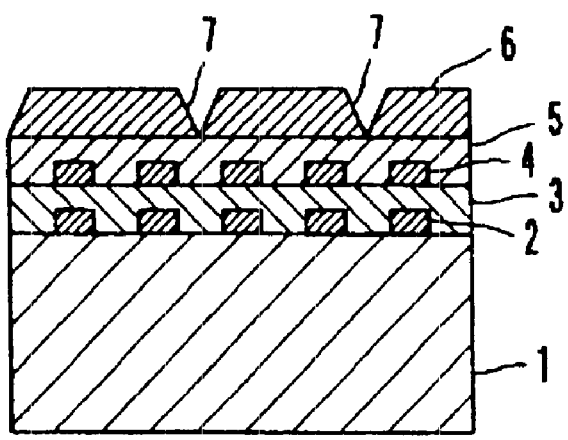
Figure 1C:
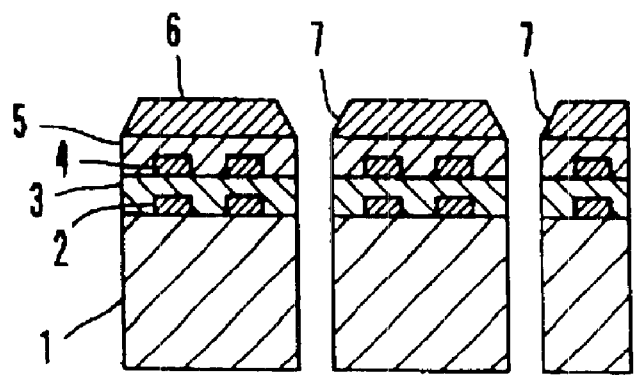

FIGS. 1A to 1C show a first preferred embodiment of the manufacturing method according to the present invention. First, as shown in FIG. 1A, a first electrode layer 2 having a specific pattern is formed with an electroconductive material on a ceramic mother board 1, and then is covered with a first insulating layer 3. Next, a second electrode layer 4 is formed over the first electrode layer 2, and is covered with a second insulating layer 5. Furthermore, a third (uppermost)

insulating layer 6 is formed on the second insulating layer 5. After that, the entire laminate is subjected to sintering.

The thickness is, for example, about 150 μm for the mother board 1, about 20 μm for the first insulating layer 3 plus the first electrode layer 2, about 20 μm for the second insulating layer 5 plus the second electrode layer 4, and from about 20 to about 30 μm for the third insulating layer 6.

The first to third insulating layers 3, 5, and 6 are preferably composed of glass, ceramic, or a heat resistant resin such as a polyimide, with each layer having the same basic components. However, a pigment including an inorganic oxide is added to the third uppermost insulating layer 6, within the range of from about 2% to about 20% by weight. As the inorganic oxide, an oxide of Co, Al, Fe, Mn, or other suitable inorganic oxide is preferably used. In particular, a Co oxide and/or an Al oxide is preferably used, as will be described later.

Next, the uppermost insulating layer 6 is irradiated with a laser beam to form break grooves 7, as shown in FIG. 1B. Hereupon, the outer dimensions of a chip inductor to be manufactured are, for example, about 1 mm×about 0.5 mm or about 0.6 mm×about 0.3 mm, and the grooves 7 are configured in the form of a lattice, according to these outer dimensions. As the laser source, a YAG laser is preferably used, however any suitable laser source may be used. Grooves with a very small width as narrow as about 30 μm and with a depth as deep as about 50 μm are formed on the insulating layer 6, which preferably includes glass as the main component.

Next, the entire laminate including the mother board 1 and electrode and insulating layers is divided along the above-described grooves 7, using a break technique such as roller breaking, as shown in FIG. 1C. Polishing is performed, if necessary, on to the divided chips, and external electrodes (not shown) are formed, followed by plating, to obtain the finished chip inductors.

In the first preferred embodiment described above, since a pigment including an inorganic oxide is added to the uppermost insulating layer 6, the pigment absorbs the energy of the laser beam, and thus the grooves 7 are effectively formed. Accordingly, when the mother board 1 is divided along the grooves 7, the division surface is not formed obliquely out of the desired dividing line, and the electrode layers 2 and 4 are not exposed. As a result, the dimensional precision of the chips is greatly improved. Furthermore, since the necessary margin for the division is greatly reduced, the area for forming the electrode layers 2 and 4 is greatly increased. In other words, since the inner diameter of the coil is increased, the L value at a high frequency is greatly increased, thus providing a greatly increased Q value.

It is noted that an eddy current loss which would otherwise occur in the insulating layer 6 at a high frequency band is prevented when an inorganic pigment including a Co oxide and/or an Al oxide is added to the insulating layer 6. Thus, degradation of the Q value at a high frequency band is prevented.

If the amount of the inorganic pigment added to the insulating layer 6 is less than about 2% by weight, the laser beam absorption effect is not achieved, and if it exceeds about 20% by weight, degradation of the Q value, and decreased strength (degradation of sintering characteristics) of the insulating layer 6 occurs. Therefore, preferably the amount of inorganic pigment added to the insulating layer is in the range of from about 2% to about 20% by weight.

Figure 2A:
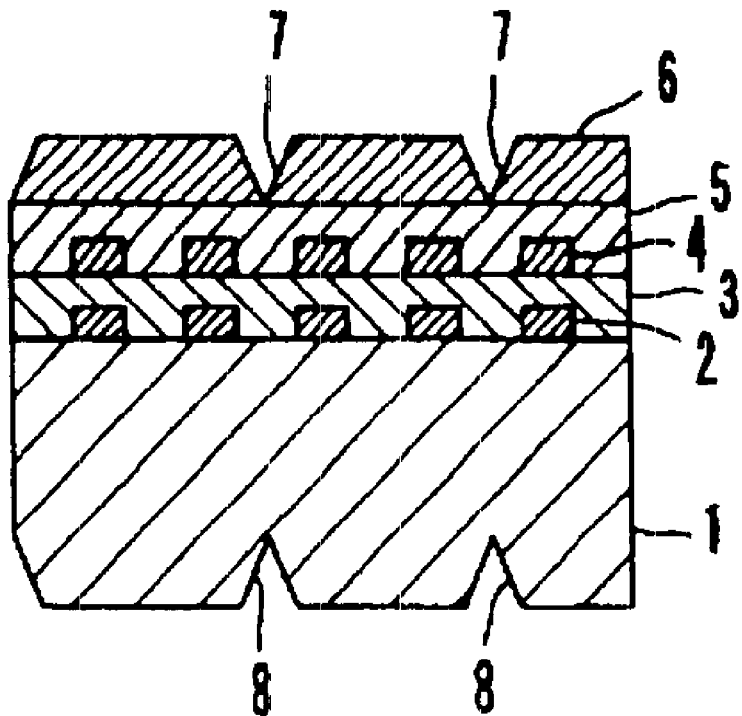
FIGS. 2A and 2B are cross-sectional views illustrating the manufacturing steps for a chip inductor according to the second preferred embodiment of the present invention.
Figure 2B:
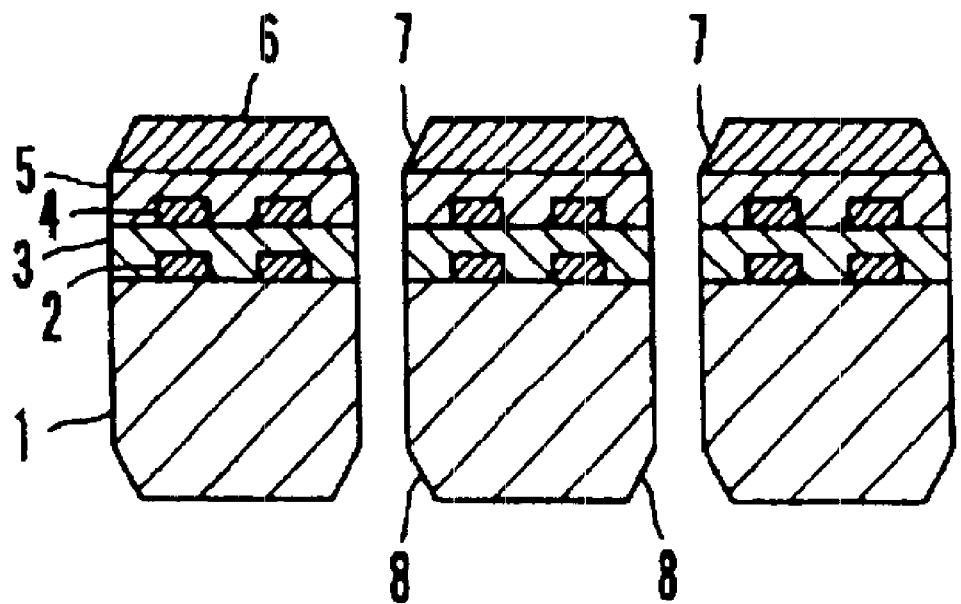

FIGS. 2A and 2B show a second preferred embodiment of the manufacturing method according to the present invention. The second preferred embodiment includes substantially the same steps as the above-described first preferred embodiment. In addition to the steps of forming the break grooves 7 on the uppermost insulating layer 6, grooves 8 corresponding to the grooves 7 are formed on the bottom surface of the mother board 1. The grooves 8 can be formed by laser beam irradiation or by other suitable methods. Next, the entire laminate including the mother board 1 and the above-described laminated layers is divided along the grooves 7 and 8 described above, using a break technique such as roller breaking.

According to the second preferred embodiment described above, since the break grooves 7 and 8 are formed on the top and bottom surfaces, respectively, the generation of burrs is effectively prevented when dividing the mother board, thus the outer dimensional precision of the chips is further improved.

The chip inductor and the manufacturing method therefor according to the present invention are not limited to the above-described preferred embodiments, and various other modifications can be made within the spirit of the present invention.

In particular, the insulating layer 6 may be omitted, thus providing the second insulating layer 5 as the uppermost insulating layer. Further, pigment may be added which includes an inorganic oxide to the first and second insulating layers 3 and 5.

As is clearly shown from the above explanations, according to the present invention, by adding a pigment including an inorganic oxide to the uppermost insulating layer at a concentration of from about 2% to about 20% by weight, the pigment acts as an absorbent of the light energy, allowing the formation of lattice-like grooves on the uppermost insulating layer by the irradiation with a laser beam, with the result that the mother board is effectively divided along the grooves. By virtue of the laser beam irradiation, it is possible to form grooves with a width as narrow as about 30 μm. When the mother board is divided along the grooves, deviation of the division surface from the grooves is prevented, and the dimensional precision of the chips is greatly improved. Furthermore, the margin for the division is minimized, with the result that the area for forming electrode layers is greatly increased, and the L value at a high frequency is greatly increased. In particular, when a Co oxide and/or an Al oxide is used as the additive, the degradation of the Q value at a high frequency is prevented.

Furthermore, when grooves are formed on the bottom surface of the mother board, corresponding to the grooves formed on the above-described uppermost insulating layer, the generation of burrs is prevented when dividing the mother board, and the outer dimensional precision of the chips is further improved.

While the present invention has been described with reference to what is presently considered to be the preferred embodiment, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A chip inductor comprising:
   a plurality of electrode layers having specific patterns and a plurality of insulating layers provided on a ceramic board;

wherein a pigment including an inorganic oxide is added to an uppermost of said plurality of insulating layers and the pigment is within a range of about 2% to about 20% of a total weight of the uppermost of said plurality of insulating layers.

2. A chip inductor according to claim 1, wherein said inorganic oxide includes at least one of a Co oxide and an Al oxide.

3. A chip inductor according to claim 1, wherein said plurality of electrode layers includes at least three electrode layers.

4. A chip inductor according to claim 1, wherein said plurality of insulating layers includes at least three insulating layers.

5. A chip inductor according to claim 1, wherein the thickness of said ceramic board is about 150 $\mu$m.

6. A chip inductor according to claim 1, wherein the thickness of said uppermost insulating layer is from about 20 $\mu$m to about 30 $\mu$m.

7. A chip inductor according to claim 1, wherein said inorganic oxide is selected from the group consisting of Co, Al, Fe, and Mn.

8. A chip inductor according to claim 1, wherein said uppermost insulating layer is composed of glass as a main component.

* * * * *